(12) United States Patent
Cho

(10) Patent No.: US 7,138,608 B2
(45) Date of Patent: Nov. 21, 2006

(54) SEALED LINE STRUCTURE FOR USE IN PROCESS CHAMBER

(75) Inventor: Chun-Ho Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 56 days.

(21) Appl. No.: 11/103,535

(22) Filed: Apr. 12, 2005

(65) Prior Publication Data

US 2005/0258142 A1 Nov. 24, 2005

(30) Foreign Application Priority Data

May 7, 2004 (KR) .................. 10-2004-0032100

(51) Int. Cl.
*F27B 5/14* (2006.01)
*F26B 19/00* (2006.01)
(52) U.S. Cl. .................... 219/390; 392/416
(58) Field of Classification Search ........ 219/390, 219/444.1, 535–539; 392/416, 418; 118/728, 118/729, 724, 725
See application file for complete search history.

(56) References Cited

U.S. PATENT DOCUMENTS

| 5,562,947 | A | * | 10/1996 | White et al. | ............. 427/255.5 |
| 5,753,891 | A | | 5/1998 | Iwata et al. | |
| 5,772,773 | A | * | 6/1998 | Wytman | ..................... 118/729 |
| 5,935,338 | A | | 8/1999 | Lei et al. | |
| 6,200,634 | B1 | | 3/2001 | Johnsgard et al. | |
| 6,376,808 | B1 | * | 4/2002 | Tachikawa et al. | ...... 219/444.1 |
| 6,387,185 | B1 | | 5/2002 | Doering et al. | |
| 6,669,784 | B1 | * | 12/2003 | Futamura et al. | ........... 118/729 |

* cited by examiner

*Primary Examiner*—Sang Paik
(74) *Attorney, Agent, or Firm*—Volentine Francos & Whitt, PLLC

(57) ABSTRACT

A sealed line structure equipped with a heater block for a process chamber for use in manufacturing a semiconductor device is provided. The structure includes a housing member, a movement prevention member is constructed of a lock nut, a clamp ring and an elastic unit, and a power line or a thermocouple line is sealed by the configuration of the housing member, the movement prevention member, a cover member, and a connector member.

18 Claims, 5 Drawing Sheets

SEALED LINE STRUCTURE FOR USE IN PROCESS CHAMBER

BACKGROUND OF THE INVENTION

1. Field of the Invention

The present invention generally relates to a sealed line structure for use in a process chamber for manufacturing semiconductor devices.

A claim of priority is made to Korean Patent Application 2004-32100, filed on May 7, 2004, the contents of which are hereby incorporated by reference in their entirety.

2. Description of the Related Arts

Semiconductor devices are generally manufactured through a series of manufacturing processes such as deposition, photolithography, etching, ion implantation, and polishing.

The deposition process, for example, forms a layer on a semiconductor substrate in a process chamber. During the deposition process, flow volume and pressure of process gases, internal pressure of the process chamber, and temperature of the semiconductor substrate are important process factors, which must be monitored.

In a conventional multi-purpose process chamber, a plate on which a semiconductor substrate is mounted is heated, or the plate itself emits heat so as to heat the semiconductor substrate.

In a system using a heater block, a power source is directly applied to the heater block. A thermocouple gauge, used as a temperature sensing unit, is connected to the heater block to monitor the temperature of a semiconductor substrate. U.S. Pat. No. 6,331,697, for example, discloses such a system.

On a heater block, an electrostatic chuck or vacuum chuck is adapted so that a semiconductor substrate is positioned and heated, or the heater block itself is equipped to chuck and directly heat the semiconductor substrate.

A power source to heat the heater block is usually disposed outside of the process chamber. An electric wire is connected to the heater block and disposed in a tubular shaped power line. It is important to seal the lead power source at the connection point with the process chamber. In addition to the electric wire, a thermocouple gauge, which monitors the temperature of the heater block, is also equipped together thereof. Specifically, one end of the electric wire is fixed to the heater block through a power line, while, the thermocouple line is adapted to attach or detach from the process chamber.

The interior of the process chamber must be under vacuum pressure during a manufacturing process, while the outside of the process chamber is under atmospheric pressure. If the connection point at the process chamber through which the electric wire is guided into the interior thereof has an air leak, the air leak may cause errors during the manufacturing process.

FIG. 1 illustrates a connection structure for a power line 2 connected to a heater block 1. FIG. 1 also shows a thermocouple line 3 connected to heater block 1. Both power line 2 and thermocouple line 3 are generally divided into upper and lower portions which are formed of different materials.

As shown in FIG. 1, in the central portion of power line 2 and thermocouple line 3, openings 2a, 3a are formed, through which an electric wire or a thermocouple gauge is inserted, respectively. The upper portion of the lines is covered with aluminum alloy material. The lower portion of the lines is threaded and formed of stainless material. The lines are generally shafts having a tubular shape. The upper end portions of the lines are fixed to heater block 1.

Power line 2 and thermocouple line 3 have a complicated sealing structure to maintain an airtight seal with the outside environment.

As shown in FIG. 2, the lower portion of power line 2 is exposed to the outside environment through a through-hole 4a formed in a process chamber wall 4. The lower portion of power line 2 comprises an O-ring 5, an adapter 6, a gasket 7, a bellows 8, and a flange collar 9, and together they are coupled to chamber wall 4 with a plurality of bolts 10 as shown in FIG. 3.

Power line 2 should seal the interior of the process chamber from the outside. However, air leaks occur because the upper portions of power line 2 made of aluminum alloy slowly erodes due to process gases used during the manufacturing processes, or air leaks occur due to welding defects.

Air leaks cause pressure in the process chamber to change, which creates process defects, and decreases production yield and productivity.

Accordingly, it is desirable to provide a sealing structure for a line capable of preventing air leaks.

SUMMARY OF THE INVENTION

According to an exemplary embodiment of the invention, a sealed line structure for a process chamber including a housing member having an upper portion fastened to a process chamber wall, and a hollow chamber formed therein in a plurality of step portions, a line inserted through an opening in the process chamber wall and through the hollow chamber, a movement prevention member coupled to one end of the line, an elastic unit disposed above the movement prevention member, and a cover member fastened to one of the step portions.

The present application also discloses A sealed line structure for a process chamber including a housing member having an upper portion fastened to a process chamber wall, and a hollow chamber formed therein in a plurality of step portions, a power line connected to a heater block located within the process chamber at one end, and inserted through an opening in the process chamber wall and through the housing member, a movement prevention member having a lock nut coupled to the other end of the power line, a clamp ring secured to one of the plurality of step portions, an elastic unit disposed above the clamp ring, a cover member having terminal pins connected to an electric wire of the power line, and fastened to the housing member, and a connector member adapted to engage the cover member.

Also disclosed is a sealed line structure for a process chamber including a housing member having an upper portion fastened to a process chamber wall, and a hollow chamber formed therein in a plurality of step portions, a thermocouple line having a thermocouple gauge connected to a heater block located within the process chamber at one end, and inserted through an opening in the process chamber wall and through the housing member, a movement prevention member having a lock nut coupled to the other end of the thermocouple line, a clamp ring secured to one of the plurality of step portions, an elastic unit disposed above the clamp ring, and a cover member fastened to a lower portion of the housing member.

BRIEF DESCRIPTION OF THE DRAWINGS

The present invention will become more fully understood from the detailed description given hereinbelow and the accompanying drawings which are given by way of illustration only, and wherein.

DETAILED DESCRIPTION

Figure 1:
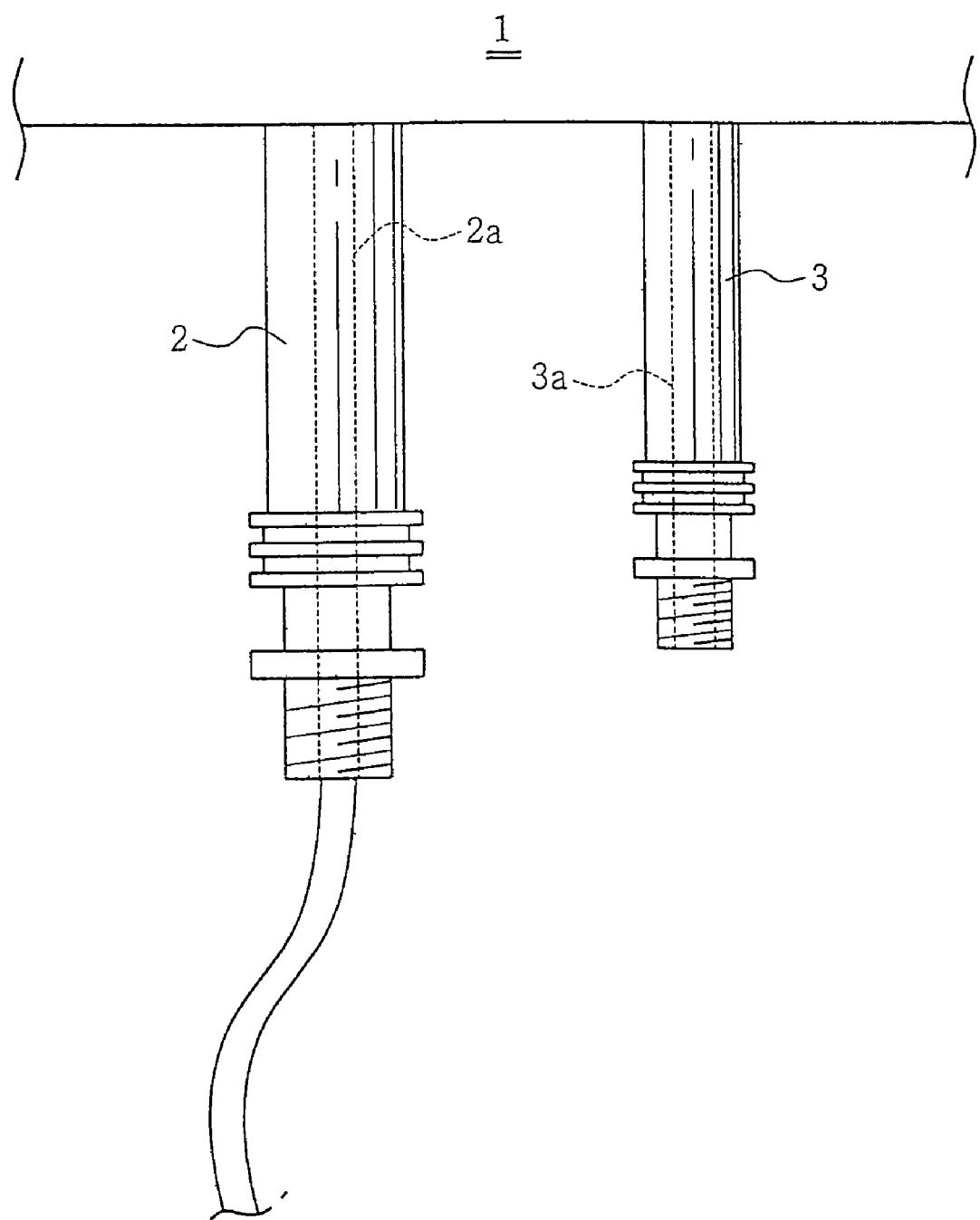
FIG. 1 is a view illustrating a conventional installation configuration of a power line and a thermocouple line with a heater block.
Figure 2:
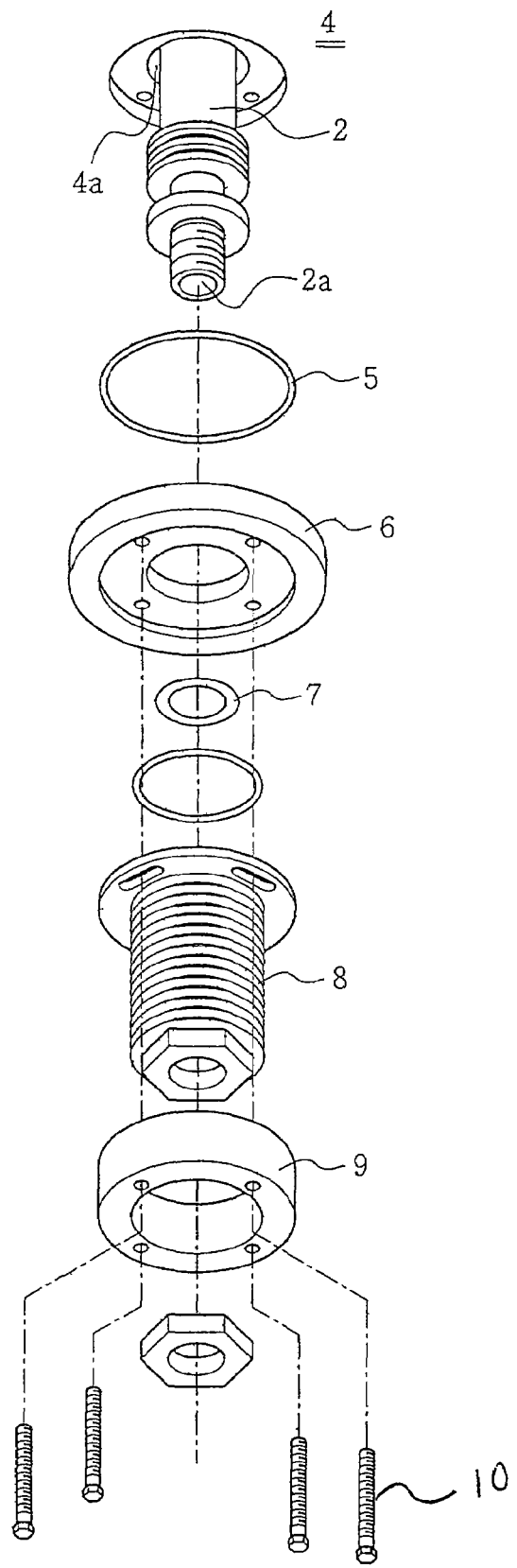
FIG. 2 is a perspective view illustrating disassembled components of a sealing structure of the conventional power line.
Figure 3:
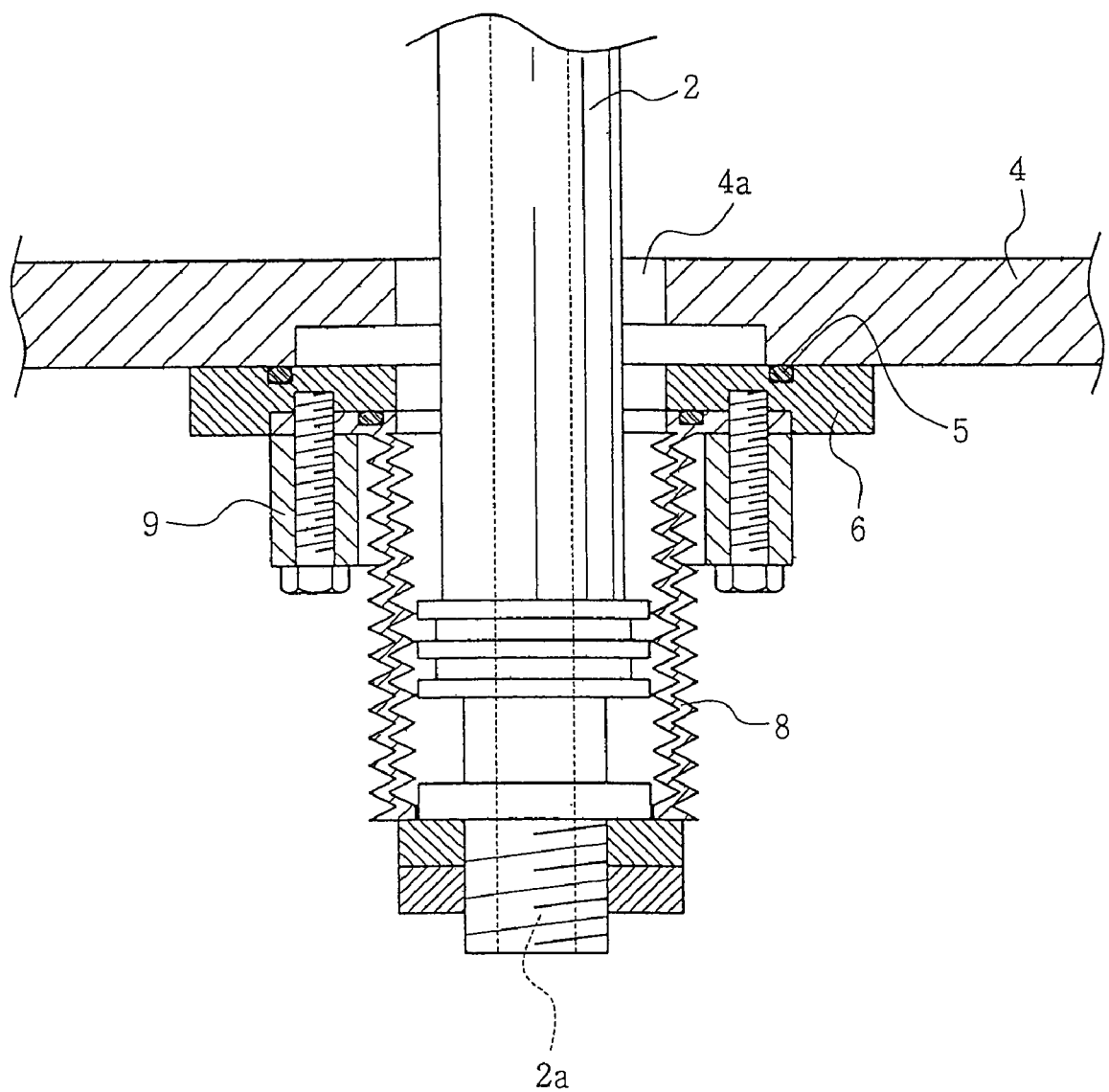
FIG. 3 is a sectional view illustrating assembled components of FIG. 2.

Hereinafter, exemplary embodiments of the present invention will be described in detail with reference to FIGS. 4 to 6. It will be understood by those skilled in the art that the present invention can be embodied by numerous different ways and is not limited to the following described embodiments. The following various embodiments are only working examples.

A sealed structure in the present invention is classified into a power line sealed structure, which is a heating unit for a heating block, and a thermocouple line sealed structure, which is a temperature monitoring unit for the heating block.

An upper portion and a lower portion of a power line 10 and a thermocouple line 20 are made of different materials. The upper portion of the lines is covered with aluminum alloy material. The lower portion of the lines is threaded and formed of stainless material.

Power line 10 is guided through a through-opening 110 formed in a chamber wall 100. Power line 10 has an insertion opening 10a, through which an electric wire 10b is inserted.

The sealed structure further includes a housing member 11, a movement prevention member 12, a cover member 13, and a connector member 14.

An upper portion of housing member 11 is formed in a flange shape, and is adhered to chamber wall 100 by a bolt 15 and an O-ring 11a. Housing member 11 has a central hollow chamber, the size which is sufficient for power line 10 to be inserted therein, and the central hollow chamber is formed in a plurality of steps where the diameter at a top step gradually increases towards a bottom step.

A movement prevention member 12 is adapted to prevent movement, i.e., in a side direction, of power line 10 by thermal-expansion when heat is transferred from a heater block.

Movement prevention member 12 includes a lock nut 12a, a clamp ring 12b, and an elastic unit 12c. An outer diameter of clamp ring 12b is formed in a size proximate the central hollow chamber of housing member 11. The lower portion of power line 10 is inserted into clamp ring 12b in such a manner to prevent side-directional movement. To prevent separation of clamp ring 12b with power line 10, a lock nut 12a is adapted under clamp ring 12b, and to minimize upward/downward movement of clamp ring 12b, an elastic unit 12c is supported over clamp ring 12b. Elastic unit 12c is preferably a coil spring.

An upper portion of elastic unit 12c is secured to a step portion of the central hollow chamber of housing member 11. A lower portion of elastic unit 12c is disposed on clamp ring 12b, and a lower portion of clamp ring 12b is secured with lock nut 12a, so that clamp ring 12b is supported between lock nut 12a and elastic unit 12c.

A cover member 13 is adapted to seal housing member 11. A bolt 16 and an O-ring 13a attaches the lowest step portion of housing member 11 with cover member 13. A terminal pin 13b is disposed through cover member 13, and has portions protruding above and below cover member 13. Terminal pin 13b protruding above cover member 13 is connected to an electric wire 10b of power line 10.

Preferably, cover member 13 is formed in a shape adapted for connector member 14 to be inserted therein.

Connector member 14 supplies a power source to the heater block from the outside the process chamber. Connector member 14 has an insertion opening 14a to engage terminal pin 13b. Connector member 14 is inserted into the open interior of cover member 13.

Figure 5:
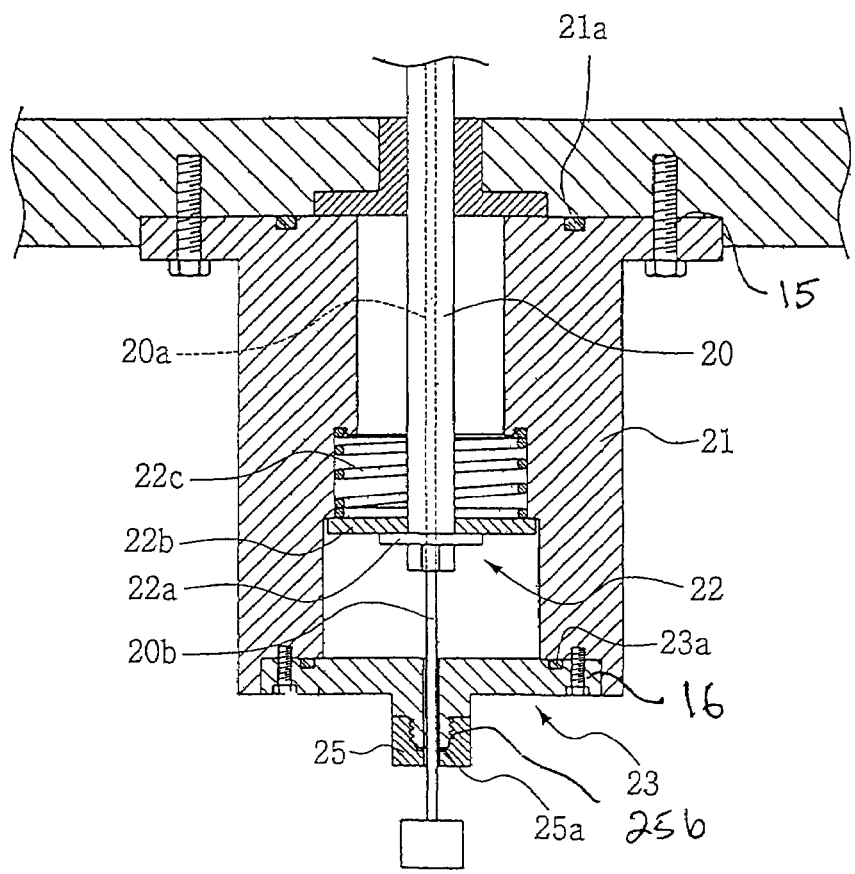
FIG. 5 is a sectional view illustrating a sealed structure for a thermocouple line of the present invention.

FIG. 5 illustrates a sealed configuration of a thermocouple line 20 according to an embodiment of the present invention.

Thermocouple line 20 is adapted to monitor the temperature of the heater block (not shown). Thermocouple line 20 has an insertion opening 20a through which a thermocouple gauge 20b is inserted therein.

A sealing structure of thermocouple line 20 includes a housing member 21, a movement prevention member 22, and a cover member 23.

Figure 4:
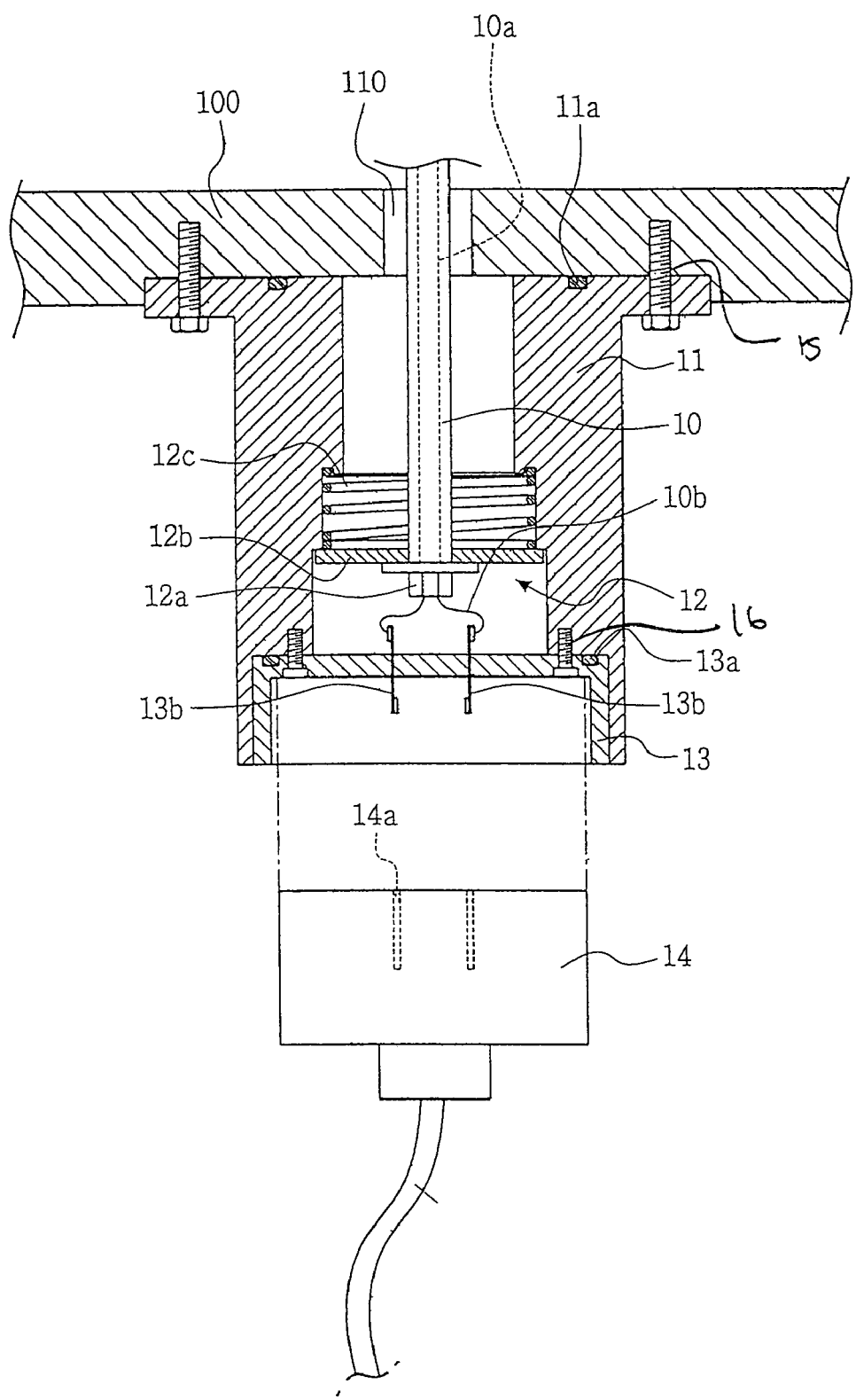
FIG. 4 is a sectional view illustrating a sealed structure for a power line according to an embodiment of the present invention.

The configuration of housing member 21 and movement prevention member 22 are the same as that of FIG. 4 for power line 10.

That is, thermocouple line 20 is inserted in a hollow chamber of housing member 21, and wherein, a lower portion of thermocouple line 20 includes a lock nut 22a, a clamp ring 22b, and an elastic unit 22c, which constitute movement prevention member 22.

Housing member 21 is encased by cover member 23. Cover member 23 is also adapted to allow thermocouple gauge 20b to be inserted at a lower portion thereof.

Thermocouple line 20 is isolated from the outside by housing member 21 and cover member 23, but a center portion of cover member 23 has an opening, thus outside-air may penetrate through the opening. However, during a manufacturing process, thermocouple gauge 20b is inserted through the opening of cover member 23 up through thermocouple line 20, thereby the opening is sealed by thermocouple gauge 20b.

Cover member 23 is configured to closely adhere to a step portion in an inner portion of housing member 21 by a bolt 16 and an O-ring 23a. Cover member 23 also has a treaded portion 25b, which protrudes downwardly from cover member 23.

A cap 25 is coupled to treaded portion 25b. An O-ring 25a is interposed between treaded portion 25b and cap 25.

Figure 6:
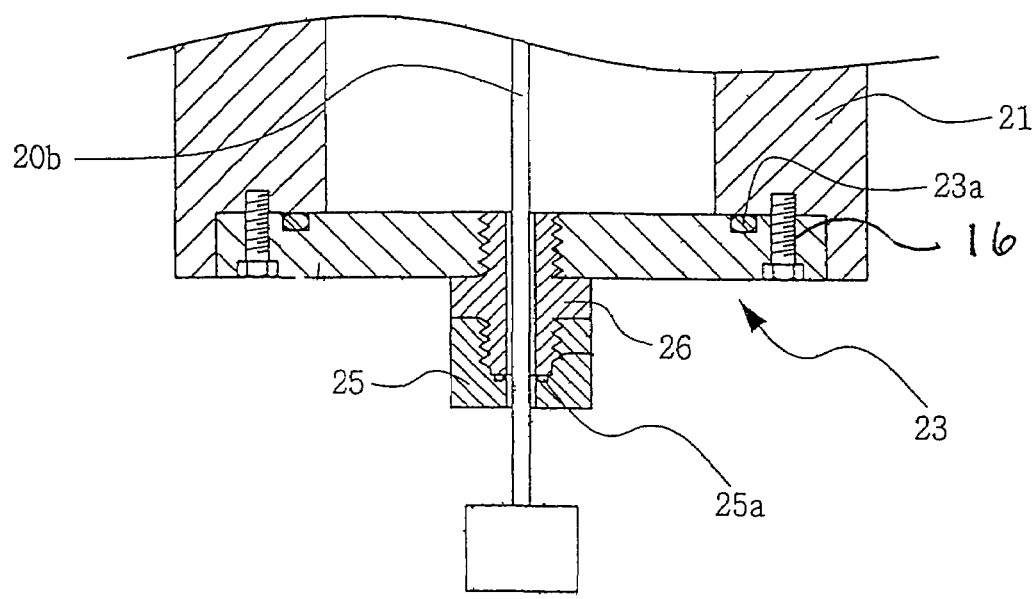
FIG. 6 is an enlarged sectional view of another embodiment for a cover member shown in FIG. 5.

In another embodiment as depicted in FIG. 6, cover member 23 may be constructed of a cap 25, a guide 26, and an O-ring 25a. Guide 26 is formed in a shape of a cross, and a center of guide 26 has an opening with sufficient diameter for thermocouple gauge 20b insertion. An upper portion and a lower portion of guide 26 are threaded, and the upper treaded portion is coupled with an opening formed in the center of cover member 23.

In an upper face of cap 25 is formed of a flute to couple with lower treaded portion of guide 26. An O-ring 25a is interposed between lower portion of guide 26 and cap 25.

According to embodiments of the present invention described above, power line 10 and thermocouple line 20 connected to a heater block are sealed on a process chamber wall, thus an inflow of outside-air into the interior of the process chamber is effectively prevented.

It will be apparent to those skilled in the art that modifications and variations can be made in the present invention without deviating from the scope of the present invention.

What is claimed is:

1. A sealed line structure for a process chamber, comprising:
    a housing member having an upper portion fastened to a process chamber wall, and a hollow chamber formed therein in a plurality of step portions;
    a line inserted through an opening in the process chamber wall and through the hollow chamber;
    a movement prevention member coupled to one end of the line;
    an elastic unit disposed above the movement prevention member; and
    a cover member fastened to one of the step portions.

2. The structure of claim 1, wherein the line is a power line, and the other end of the power line is connected to a heater block located within the process chamber.

3. The structure of claim 1, wherein the line is a thermocouple line, and the other end of the thermocouple line is connected to a heater block located within the process chamber.

4. The structure of claim 1, wherein the movement prevention member further comprises a lock nut coupled to an end of the line.

5. The structure of claim 1, wherein the elastic unit is a coil spring.

6. The structure of claim 1, wherein the upper portion of the housing member is fasten to the process chamber wall with a plurality of bolts and an O-ring disposed between the housing member and the process chamber wall.

7. The structure of claim 1, wherein the cover member is fasten to the housing member with a plurality of bolts and an O-ring disposed between the cover member and housing member.

8. A sealed line structure for a process chamber, comprising:
    a housing member having an upper portion fastened to a process chamber wall, and a hollow chamber formed therein in a plurality of step portions;
    a power line connected to a heater block located within the process chamber at one end, and inserted through an opening in the process chamber wall and through the housing member;
    a movement prevention member having a lock nut coupled to the other end of the power line;
    a clamp ring secured to one of the plurality of step portions;
    an elastic unit disposed above the clamp ring;
    a cover member having terminal pins connected to an electric wire of the power line, and fastened to the housing member; and
    a connector member adapted to engage the cover member.

9. The structure of claim 8, wherein the elastic unit is a coil spring.

10. The structure of claim 8, wherein the connector member supplies a power source.

11. The structure of claim 8, wherein upper portion of the housing member is fasten to the process chamber wall with a plurality of bolts and an O-ring disposed between the housing member and the process chamber wall.

12. The structure of claim 8, wherein the cover member is fasten to the housing member with a plurality of bolts and an O-ring disposed between the cover member and housing member.

13. A sealed line structure for a process chamber, comprising:
    a housing member having an upper portion fastened to a process chamber wall, and a hollow chamber formed therein in a plurality of step portions;
    a thermocouple line having a thermocouple gauge connected to a heater block located within the process chamber at one end, and inserted through an opening in the process chamber wall and through the housing member;
    a movement prevention member having a lock nut coupled to the other end of the thermocouple line;
    a clamp ring secured to one of the plurality of step portions;
    an elastic unit disposed above the clamp ring; and
    a cover member fastened to a lower portion of the housing member.

14. The structure of claim 13, wherein the cover member is "T" shaped, a lower portion of the cover member is treaded and adapted to engage a cap, and having an opening formed therein, and wherein the thermocouple gauge is inserted through the opening.

15. The structure of claim 13, further comprising:
    a guide formed in a shape of a cross and having treaded lower and upper portions, and the upper treaded portion adapted to engage the cover portion;
    a cap adapted to engage the lower treaded portion of the guide; and,
    an opening formed through the guide and the cap, and wherein the thermocouple gauge is inserted through the opening.

16. The structure of claim 13, wherein the elastic unit is a coil spring.

17. The structure of claim 13, wherein upper portion of the housing member is fasten to the process chamber wall with a plurality of bolts and an O-ring disposed between the housing member and the process chamber wall.

18. The structure of claim 13 wherein the cover member is fasten to the housing member with a plurality of bolts, and an O-ring disposed between the cover member and housing member.

* * * * *